(12) United States Patent
Aoki

(10) Patent No.: US 7,688,066 B2
(45) Date of Patent: Mar. 30, 2010

(54) ROTATION DETECTOR

(75) Inventor: Yuhide Aoki, Isesaki (JP)

(73) Assignee: Hitachi, Ltd., Tokyo (JP)

( * ) Notice: Subject to any disclaimer, the term of this patent is extended or adjusted under 35 U.S.C. 154(b) by 228 days.

(21) Appl. No.: 11/722,152

(22) PCT Filed: Jan. 11, 2006

(86) PCT No.: PCT/JP2006/000215

§ 371 (c)(1),
(2), (4) Date: Jun. 19, 2007

(87) PCT Pub. No.: WO2006/075620

PCT Pub. Date: Jul. 20, 2006

(65) Prior Publication Data

US 2009/0091315 A1    Apr. 9, 2009

(51) Int. Cl.
*G01B 7/30* (2006.01)

(52) U.S. Cl. .................... 324/207.25; 324/174

(58) Field of Classification Search .............. 324/174, 324/207.21, 207.25, 249, 252; 73/514.31, 73/514.39; 257/421–427
See application file for complete search history.

(56) References Cited

U.S. PATENT DOCUMENTS 6,157,186 A    12/2000  Aoki et al.
6,316,840 B1 *  11/2001  Otani .................... 257/787

FOREIGN PATENT DOCUMENTS

| JP | 2-246176 A | 10/1990 |
|----|------------|---------|
| JP | 5-14829 U | 2/1993 |
| JP | 11-14644 A | 1/1999 |
| JP | 2000-321093 A | 11/2000 |

* cited by examiner

*Primary Examiner*—Bot L LeDynh
(74) *Attorney, Agent, or Firm*—Foley & Lardner LLP

(57) ABSTRACT

A rotation detector includes: a magnet to form a magnetic field between the magnet and a rotary member; a magnetism detection element positioned in the proximity of the magnet to detect a variation in the magnetic field due to a rotation of the rotary member; and a signal processing circuit 3 to process a signal from the magnetism detection element and which is coated and sealed with a resin 7, recess portions 14a, 14b which are lower than electrode forming regions 15 are formed at adjoining regions adjacent to electrode forming regions 15 on which surface electrodes 4 are installed and resin 7 is filled within recess portions 14a, 14b. Thus, the rotation detector which can suppress the deficiency generated at a part mounted on a circuit forming portion, at junctions between the part and surface electrodes, or so forth due to expansion and shrinkage involved in a temperature variation can be provided.

15 Claims, 3 Drawing Sheets

ROTATION DETECTOR

TECHNICAL FIELD

The present invention relates to a rotation detector.

BACKGROUND ART

Various types of rotation detectors have conventionally been proposed. The following Patent Literature 1 describes one example of the conventional rotation detectors.

One of the various types of rotation detectors described in Patent Literature 1 includes: a magnet forming a magnetic field between the magnet and a rotary member; a magnetism detection element disposed in the proximity of the magnet to detect that the magnetic field generated by the magnet is varied due to rotation of the rotary member; and a signal processing circuit for processing a signal from the magnetism detection element.

The signal processing circuit is constructed with various parts mounted on a board. Then, a resin is filled within a recess portion of a casing in a state in which the signal processing circuit (that is to say, the board on which the parts are mounted) is accommodated. Thus, the signal processing circuit is sealed and coated with the resin.

Patent Literature 1: A Japanese Utility Model Registration Application Publication (Jikkai) No. Heisei 5-14829.

DISCLOSURE OF THE INVENTION

Problem to be Solved by the Invention

In the above-described conventional rotation detector, there are many cases where the board and the resin used for a sealing purpose are of different material qualities. In this case, along with variation in temperature, differences in expansion and shrinkage quantities are generated between the board and the resin. These differences cause stresses to be generated on the parts mounted on the board (or to be resided in the parts or the junction portions) and on the junction portions between the board and the parts. Thus, there is a possibility of occurrence in junction failures or part failures.

It is, in view of the above-described circumstances, an object of the present invention to provide a rotation detector which is capable of suppressing deficiencies generated on the parts and junction portions due to the expansion and the shrinkage generated along with the temperature variation.

Means to Solve the Problem

To achieve the above-described object, according to the invention defined in application claim 1, especially, an adjoining region adjacent to an electrode forming region is formed to be lower than the electrode forming region and the resin is filled within the adjoining region.

Hence, since the resin is filled up to the adjoining region adjacent to the electrode forming region, the differences in the expansion quantity and the shrinkage quantity between a circuit forming portion side and a sealing resin side become small along with temperature variation and thermal stresses generated at the part and the junction portion can be reduced.

In addition, according to the invention described in the application claim 2, the above-described adjoining region which is interposed between two electrode forming regions corresponding to respective two surface electrodes on which the part is mounted is formed to be lower than the two electrode forming regions and the resin is filled within the adjoining region.

Hence, since the resin can be disposed within the adjoining region which is interposed between the electrode forming regions on which the part is mounted, the thermal stresses generated on the part, the junction, and so forth can effectively be reduced.

In addition, the invention described in the application claim 3 is that, in the rotation detector as claimed in application claim 2, the adjoining region which is positioned at an outside in an installation direction of the part with respect to one of the electrode forming regions which corresponds to either one of the two surface electrodes on which the part is mounted is formed to be lower than the one of the electrode forming regions and the resin is filled within the adjoining region.

Hence, since the resin can be disposed at the adjoining region positioned at the outside of the installation direction of the part with respect to the electrode forming regions on which the part is installed, the thermal stresses generated at the part and the adjoining region can, furthermore, be effectively reduced.

The invention described in the application claim 4 has a feature such that, in the rotation detector as claimed in application claim 2, a region wider than the part except the portion on which the surface electrode is formed is formed to be lower than the electrode forming regions.

The invention described in the application claim 5 has a feature such that, in the rotation detector as claimed in application claim 2, the part is joined using an electrically conductive adhesive onto each surface of the surface electrodes.

The invention described in application claim 6 has a feature such that the rotation detector comprising: a casing formed of a resin material; and a signal processing circuit installed within the casing, the signal processing circuit being sealed and coated with a resin, wherein the signal processing circuit includes a part mounted on a surface electrode extended within the casing and a recess portion within which a sealing resin is filled is formed in the proximity of a portion of a circuit forming portion on which the part is mounted.

The invention described in application claim 7 has a feature such that, in the invention described in application claim 6, the recess portion is formed between the two surface electrodes on which the part is installed.

The invention described in application claim 8 has a feature such that, in the invention described in the application claim 7, another recess portion is formed on an opposite side of the other of the two surface electrodes with respect to one of the two surface electrodes.

The invention described in application claim 9 has a feature that, in the invention described in application claim 7, the recess portion is formed to be larger than a width of the part expect the portions at which the surface electrodes are formed.

The invention described in application claim 10 has a feature such that, in the invention described in application claim 7, the recess portion is formed for a length in a shortened direction of the part to be larger than the width of the part.

The invention described in the application claim 11 has a feature such that, in the rotation detector as claimed in claim 7, the part is joined onto each surface of the surface electrodes with the electrically conductive adhesive.

The invention described in the application claim 12 has a feature such that a rotation detector comprising: a magnet configured to form a magnetic field between the magnet and a rotary member; a magnetism detection element positioned in the proximity of the magnet and configured to detect a variation in the magnetic field due to rotation of the rotary member; and a signal processing circuit configured to process a signal from the magnetism detection element, the signal processing circuit being coated and sealed with a resin, wherein the signal processing circuit includes apart mounted on a circuit forming portion on which a surface electrode is installed and a recess portion within which the sealing resin is formed in the proximity of a portion of the circuit forming portion on which the part is mounted.

The invention described in application claim 13 has a feature such that, in the invention as claimed in application claim 12, the recess portion is formed between two surface electrodes on which the part is installed.

The invention as described in application claim 14 has a feature such that, in the invention as claimed in application claim 13, another recess portion is formed at an opposite side of the other of the two surface electrodes with respect to one of the two surface electrodes.

The invention as described in application claim 15 has a feature that, in the invention described in application claim 13, the recess portion is formed to be larger than a width of the part except portions at which the surface electrodes are formed.

The invention described in the application claim 16 has a feature that, in the rotation detector as described in application claim 13, the recess portion is formed for a length in the shortened direction of the part to be larger than a width of the part.

The invention described in the application claim 17 has a feature such that, in the invention as claimed in application claim 13, the part is joined onto each surface of the surface electrodes with an electrically conductive adhesive.

BEST MODE FOR CARRYING OUT THE INVENTION

Hereinafter, a preferred embodiment which embodies the present invention will be described with reference to the drawings. Hereinafter, a rotation detector which is to be mounted in an internal combustion engine for an automotive vehicle will be exemplified.

Figure 1:
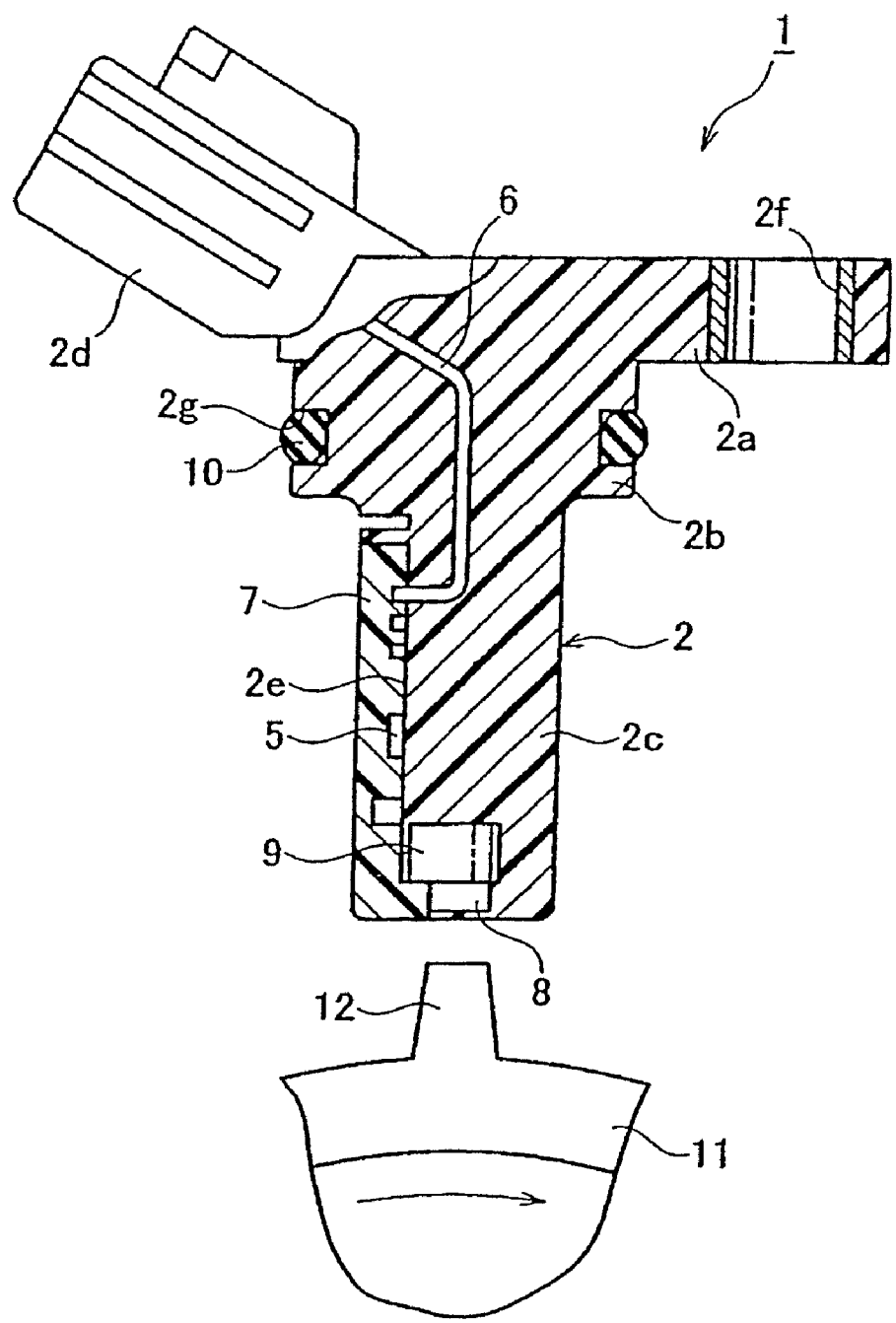
FIG. 1 is a cross sectional view of a rotation detector in a preferred embodiment according to the present invention.
Figure 2:
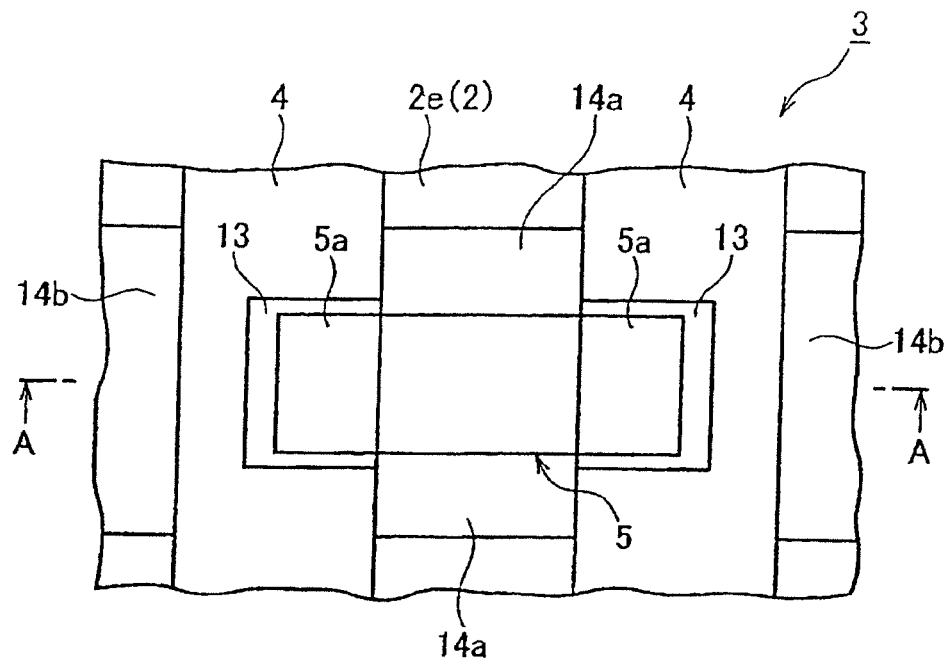
FIG. 2 is a plan view of a circuit forming portion of the rotation detector in the preferred embodiment according to the present invention and a view representing a state before the circuit forming portion is sealed with a resin.
Figure 3:
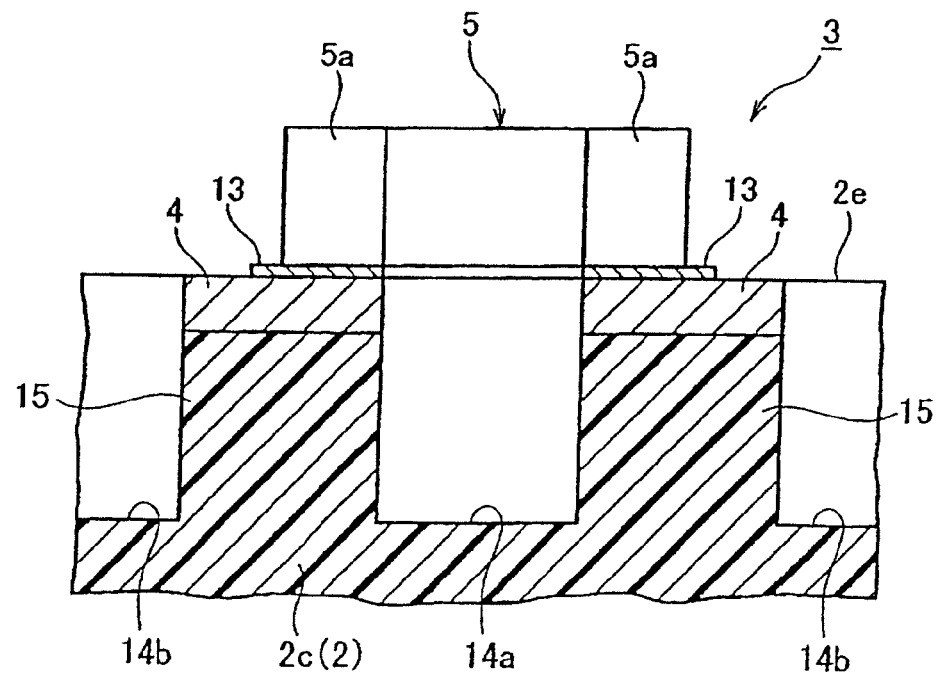
FIG. 3 is a cross sectional view of the circuit forming section of the rotation detector in the preferred embodiment according to the present invention and a view representing a state before sealed with the resin (cut away along a line A-A in FIG. 2).
Figure 4:
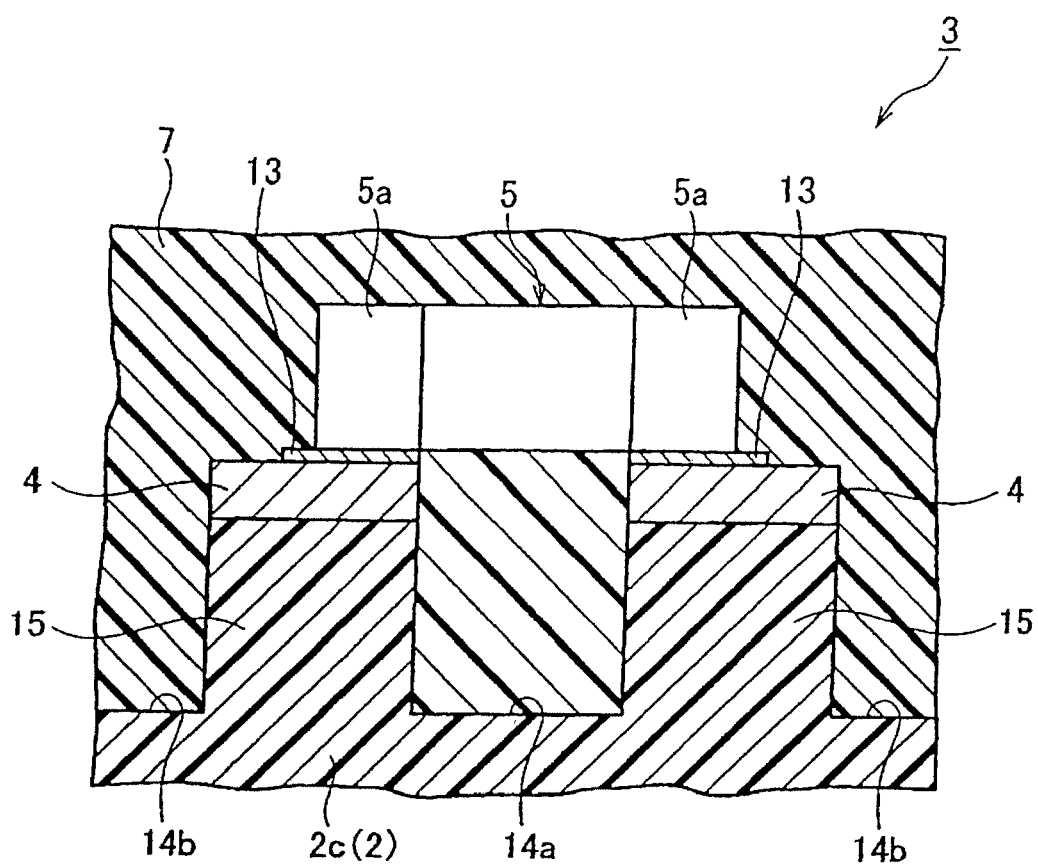
FIG. 4 is a cross sectional view of the circuit forming portion in the preferred embodiment according to the present invention and a view representing a state after the circuit forming portion is sealed with the resin (a view representing that the structure shown in FIG. 3 is sealed with the resin).

FIG. 1 shows across sectional view of the rotation detector in the preferred embodiment according to the present invention. FIG. 2 shows a plan view of a circuit forming portion of the rotation detector representing that the circuit forming portion is in a state before sealed with a resin. FIG. 3 shows a cross sectional view of the circuit forming portion and representing that the circuit forming portion is in a state before sealed with the resin (a cross sectional view cut away along a line A-A in FIG. 2). FIG. 4 shows a cross sectional view of the circuit forming portion after the resin is sealed (a view representing that a structure shown in FIG. 3 is sealed with the resin).

Rotation detector 1 according to this embodiment is provided with a casing 2 made of the resin (for example, a thermoplastic resin; a polyamide or so forth).

Casing 2 includes: an attachment flange portion 2a in which a throughhole 2f through which a tightening member such as a bolt is penetrated is provided; an approximately circular column shaped inserting portion 2b to be inserted through a throughhole (not shown) installed on an internal combustion engine and so forth; a main body portion 2c in an approximately rectangular column shape on which a signal processing circuit 3 is formed; and connector portion 2d projected toward an external side.

An annular groove portion 2g is formed on an outer peripheral wall of inserting portion 2b. An O ring 10 attached on groove portion 2g serves to secure a sealing between the outer peripheral wall of inserting hole 2b and an inner wall of the throughhole through which inserting portion 2g is inserted.

A flat surface 2e extended along an attachment direction (an inserting direction) of the rotation detector is formed on main body portion 2c, a part 5 is mounted on this flat portion 2e to form a signal processing circuit 3. That is to say, this flat portion 2e provides a circuit forming portion.

Then, a magnetism detection element (for example, Hall element) 8 and a magnet (a permanent magnet) 9 are attached onto a tip end portion of main body portion 2c. Magnetism detection element 8 is disposed on the tip end side of magnet 9 to oppose against a tooth 12 of a rotary plate 11 and detects a variation of a magnetic field (a magnetic flux density) between magnet 9 and rotary plate 11 due to rotation of rotary plate 11 constituted as a magnetic material. This magnetism detection element 8 is electrically connected to signal processing circuit 3 via a wiring not shown and this signal processing circuit 3 performs a predetermined processing (for example, an amplification) for the magnetism detection element 8 by means of the signal processing circuit 3).

Furthermore, signal processing circuit 3 is electrically connected to a terminal (not shown) within a connector portion 2d via a terminal 6 which is insert molded within casing 2. A processing result of signal processing circuit 3 is outputted to an external microcomputer (not shown) via a harness (not shown) connected to connector portion 2d.

In addition, predetermined parts 5 are all mounted on flat surface 2e and, after signal processing circuit 3 is architected, flat surface 2e is coated with a resin (for example, a thermosetting resin such as an epoxy resin) and sealed therewith. That is to say, signal processing circuit 3 is coated and sealed with the resin to secure the sealing of signal processing circuit 3.

Hereinafter, a detailed structure of signal processing circuit 3 will be described with reference to FIGS. 2 through 4.

A plurality of surface electrodes 4 are buried into and formed on flat surface 2e. In this embodiment, surfaces of surface electrodes 4 and a surface of flat surface 2e are set to have approximately the same height. These surface electrodes 4 are appropriately patterned on flat surface 2e to function as a wiring pattern to interconnect between the plurality of parts 5 on flat surface 2e.

Part 5 is mounted to bridge the plurality of surface electrodes 4. Electrodes 5a are formed on an outer peripheral surface of both end portions of part 5 shown in FIGS. 2 through 4 along their elongated directions in place of no presence of lead wires or so forth to establish an electrical connection. A form of, so-called, a face mounting (a surface mounting) is adopted for each electrode 5a to be joined to a corresponding one of surface electrodes 4. In this embodiment, an electrically conductive adhesive 13 is used to join each electrode 5a on the surface of surface electrodes 4. This junction achieves the fixture of part 5 and establishes the electrical connection between electrodes 5a of part 5 and surface electrodes 4.

Then, in this embodiment, recess portions 14a, 14b are formed on adjoining regions respectively adjacent to electrode forming regions 15 on which surface electrodes 4 are installed. One 14a of recess portions is formed between two electrode forming regions 15, 15 corresponding to two surface electrodes 4 on which part 5 is installed. On the other hand, the other recess portion 14b is formed on each of positions which are outside in an installation direction (elongated direction) of part 5 with respect to two electrode forming regions 15, 15. It should be noted that other recess portion 14b is positioned at an opposite side of other surface electrode 4 for each surface electrode 4 (or recess portion 14a).

In addition, these recess portions 14a, 14b are formed over both sides of outer portions in a width direction of part 5 (a direction orthogonal to the installation direction, shortened direction; in FIG. 2, a vertical direction). That is to say, a width of each recess portion 14a, 14b (a length of each of recess portions 14a, 14b in the width direction in FIG. 2) is wider than a width of part 5.

Then, as shown in FIG. 4, a resin molding after part 5 is mounted causes a resin 7 to be filled within recess portions 14a, 14b. Thus, in this embodiment, resin 7 is present at a lower side (a circuit forming portion side) in addition to an upper side of flat surface 2e.

In the above-described embodiment, recess portions 14a, 14b are provided on regions adjacent to electrode forming regions 15 and resin 7 is filled within these recess portions 14a, 14b. Thus, resin 7 can be disposed on flat surface 2e, viz., the circuit forming portion side. Hence, the differences in the expansion quantity and the shrinkage quantity generated along with temperature variation between the circuit forming portion and circuit forming portion sealing resin 7 become small. Thus, the thermal stresses generated on part 5 and the junctions between surface electrodes 4 and part 5 can be reduced.

In addition, in this embodiment, resin 7 can be disposed in one recess portion 14a formed on regions (adjoining regions) between electrode forming regions 15, corresponding to two surface electrodes 4 on which part 5 is installed. Hence, the thermal stresses generated on part 5 and junction portions between part 5 and surface electrodes 4 can effectively be reduced.

Since resin can be disposed within other recess portion 14b formed on each of the regions (adjoining region) positioned at the outside of the installation direction for the electrode forming region corresponding to surface electrodes 4 on which part 5 is installed, resin 7 can be disposed in the side mutually opposing two surface electrodes 4. Hence, the thermal stresses generated on part 5 and on the junctions between part 5 and surface electrodes 4 can furthermore effectively be reduced.

The above-described structure of rotation detector in the embodiment is especially effective in the case where such a surface mounting part as part 5 is used and in the case where the conductive adhesive 13 is used to join the surface mounting part to each surface electrode 4. There are many cases where these junctions are most fragile for the expansion and shrinkage along with the temperature variation. Thus, recess portions 14a, 14b are provided so that the structure in which resin 7 is disposed at the circuit forming portion side is effective to suppress strips in the junctions.

In addition, since, in the above-described embodiment, flat surface 2e as a part of casing 2 is used for the circuit forming portion, the number of parts and a labor-hour cost of assemble can be reduced as compared with a case where a board is installed in addition to casing 2. Thus, there is an advantage that a manufacturing cost can accordingly be reduced.

It should be noted that the present invention can be embodied to the following other preferred embodiments. The same action and advantages as the above-described embodiment in the case of the following other preferred embodiments.

(1) Although the above-described embodiment exemplifies a case where the surface mounting parts are used, the present invention is effective in a case where parts with no surface mounting are used.

(2) In addition, the above-described embodiment exemplifies a portion of casing utilized as the circuit forming portion. However, the present invention is effective in a case where part is mounted on another board to form the signal processing circuit. However, in this case, the recess portions are formed on the other board.

(3) In addition, the above-described embodiment exemplifies the sealing resin filled on the casing. However, the present invention is effective in a case of the structure where, for example, the signal processing circuit whose part is mounted on the board is accommodated within the casing and the resin is filled within the casing.

(4) Furthermore, in the above-described embodiment, recess portions 14a, 14b are formed on the adjoining regions. It is of course that, especially, for the adjoining regions which are outside in the installation direction, in place of recess portion 14b, the corresponding adjoining region may be formed in a step difference shape to be lower than electrode forming regions 15 and resin 7 may be filled at a portion at which the step difference portion is lowered. In this alternative case, the same advantages can be achieved. In this case, a depth, a magnitude, and a shape of the portion at which the step difference is lower may variously be set. This portion may, for example, be extended along the installation direction to an outer edge of the circuit forming portion (flat surface 2e) or may be extended along electrode forming regions 15. The depth of this portion may appropriately be varied.

In addition, technical ideas except the claims that can be grasped from the embodiment will be described below together with their effects.

(A) In the rotation detector claimed in claims 1 through 3, it is suitable to perform the surface mounting of part on the circuit forming portion.

Consequently, a junction failure at the junction portion between the electrodes of part and the surface electrodes can be suppressed.

(B) In the rotation detector of any one of the claims 1 through 3 and the above (A), it is suitable for forming the circuit forming portion in the casing.

Thus, as compared with the case where the signal processing circuit is architected on the other board, the number of parts and the labor-hour cost of assembly can be reduced and, accordingly, the manufacturing cost can be reduced.

The invention claimed is:
1. A rotation detector comprising:
a magnet configured to form a magnetic field between the magnet and a rotary member;

a magnetism detection element positioned in the proximity of the magnet to detect a variation in the magnetic field generated by a rotation of the rotary member; and a signal processing circuit configured to perform a signal processing for a signal from the magnetism detection element, the signal processing circuit being sealed and coated with a resin;

wherein the signal processing circuit includes a part mounted on a surface electrode;

wherein an adjoining region adjacent to an electrode forming region on which the surface electrode is installed is formed to be lower than the electrode forming region and formed as a recess from one end surface of the surface electrode toward a main body portion of a casing and the resin is filled within the adjoining region.

2. The rotation detector as claimed in claim 1, wherein the adjoining region which is interposed between two electrode forming regions respectively corresponding to surface electrodes on which the part is installed is formed to be lower than the two electrode forming regions and the resin is filled within the adjoining region.

3. The rotation detector as claimed in claim 2, wherein the adjoining region which is positioned at an outside in an installation direction of the part with respect to one of the electrode forming regions which corresponds to either one of the two surface electrodes on which the part is mounted is formed to be lower than the one of the electrode forming regions and the resin is filled within the adjoining region.

4. The rotation detector as claimed in claim 2, wherein a region which is wider than the part is formed to be lower than the electrode forming regions except portions on which the surface electrodes are formed.

5. The rotation detector as claimed in claim 2, wherein the part is joined using an electrically conductive adhesive onto surfaces of the surface electrodes.

6. A rotation detector comprising:

a magnet configured to form a magnetic field between the magnet and a rotary member;

a magnetism detection element positioned in the proximity of the magnet and configured to detect a variation in the magnetic field due to rotation of the rotary member; and a signal processing circuit configured to process a signal from the magnetism detection element, the signal processing circuit being coated and sealed with a resin, wherein the signal processing circuit includes a part mounted on a circuit forming portion on which a surface electrode is installed and a recess portion within which the sealing resin is formed in the proximity of a portion of the circuit forming portion on which the part is mounted, wherein the recess portion is formed from one end surface of the surface electrode toward a main body portion of a casing between two surface electrodes with respect to one of the two surface electrodes.

7. The rotation detector as claimed in claim 6, wherein another recess portion is formed on an opposite side of the other of the two surface electrodes with respect to one of the two surface electrodes.

8. The rotation detector as claimed in claim 6, wherein the recess portion is formed to be larger than a width of the part except portions on which the surface electrodes are formed.

9. The rotation detector as claimed in claim 6, wherein the recess portion is formed for a length in a shortened direction of the part to be larger than the width of the part.

10. The rotation detector as claimed in claim 6, wherein the part is joined onto each surface of the surface electrodes with an electrically conductive adhesive.

11. The rotation detector as claimed in claim 1, wherein all of the resins adjoined to the part are the same resin.

12. The rotation detector as claimed in claim 1, wherein the casing forms the electrode forming region on which the surface electrode is installed so that the casing directly supports the surface electrode and the part mounted on the surface electrode, wherein the casing forms the recess of the adjoining region and the recess is filled with the resin.

13. The rotation detector as claimed in claim 12, wherein the casing forms an outer surface, wherein the part and the surface electrode are located below the outer surface towards a central portion of the casing, wherein the recess extends away from the outer surface towards the central portion of the casing.

14. The rotation detector as claimed in claim 6, wherein the casing forms the circuit forming portion on which the surface electrode is installed so that the casing directly supports the surface electrode and the part mounted on the surface electrode, wherein the casing forms the recess portion.

15. The rotation detector as claimed in claim 14, wherein the casing forms an outer surface, wherein the part and the surface electrode are located below the outer surface towards a central portion of the casing, wherein the recess extends away from the outer surface towards the central portion of the casing.

* * * * *